US006819134B2

(12) United States Patent
Jang

(10) Patent No.: US 6,819,134 B2
(45) Date of Patent: Nov. 16, 2004

(54) DECODING CIRCUIT FOR WAFER BURN-IN TEST

(75) Inventor: Ji Eun Jang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 151 days.

(21) Appl. No.: 10/331,287

(22) Filed: Dec. 30, 2002

(65) Prior Publication Data

US 2004/0000932 A1 Jan. 1, 2004

(30) Foreign Application Priority Data

Jun. 29, 2002 (KR) ................................. 10-2002-0037637

(51) Int. Cl.[7] .............................................. H03K 19/00
(52) U.S. Cl. ......................... 326/16; 326/105; 365/201
(58) Field of Search ............................. 326/16, 37, 38, 326/46, 105; 365/201

(56) References Cited

U.S. PATENT DOCUMENTS 6,014,336 A * 1/2000 Powell et al. ............... 365/201
6,414,890 B2 * 7/2002 Arimoto et al. ............ 365/201
6,640,323 B2 * 10/2003 Akram ....................... 714/724

* cited by examiner

Primary Examiner—Don Le
(74) Attorney, Agent, or Firm—Marshall, Gerstein & Borun LLP

(57) ABSTRACT

A decoding circuit for a wafer burn-in test internally generates a strobe signal during the wafer burn-in test by using external input address signals, thereby decreasing the number of input pads required to receive external input strobe address signals. A plurality of pulse generating units respectively delay and logically combine a plurality of external input address signals to generate pulses. Thereafter, an internal strobe signal is generated by respectively delaying and logically operating the pulses from the pulse generating units.

19 Claims, 5 Drawing Sheets

DECODING CIRCUIT FOR WAFER BURN-IN TEST

BACKGROUND

1. Technical Field

The present invention relates to a decoding circuit for a wafer burn-in test, and in particular to a decoding circuit for a wafer burn-in test that internally generates a strobe signal by using external input address signals for the wafer burn-in test.

2. Description of the Related Art

A conventional decoding circuit for a wafer burn-in test receives a strobe address signal for generating a strobe signal and a plurality of input address signals for controlling a decoding operation in the wafer burn-in test. The number of input pins required on a conventional decoding circuit corresponds to the sum of the number of the strobe address signals and the number of the input address signals. Accordingly, as the number of input addresses increase, the area for the input pad containing the input pins also increases, thereby increasing the whole layout area of a semiconductor memory device. In consideration of the relatively large area of the input pad in a typical semiconductor memory device, the number of decoding circuit input pads must be decreased in order to reduce the whole layout area.

Referring to FIG. 1, a conventional decoding circuit for a wafer burn-in test is illustrated. As described, the conventional decoding circuit for the wafer burn-in test includes an address control unit 10, a strobe signal generating unit 20 and a decoding unit 30.

In general, the address control unit 10 logically operates external input address signals ADD<8>, ADD<9>, ADD<11> and ADD<12> and a test signal WBI, and generates address signals AWB<8>, AWB<9>, AWB<11> and AWB<12>. In addition, the address control unit 10 buffers the address signals AWB<9>, AWB<11> and AWB<12>, and generates address signals AWD<9>, AWD<11> and AWD<12>.

The strobe signal generating unit 20 receives the strobe address signal AWB<8>, and generates a strobe signal VCMDP.

The decoding unit 30 receives the address signals AWBD<9>, AWD<9>, AWBD<11>, AWD<11>, AWBD<12> and AWD<12> from the address control unit 10 and the strobe signal VCMDP from the strobe signal generating unit 20, and decodes the received signals. In addition, the decoding unit 30 selectively outputs an all word line driving signal ALL, an even word line driving signal EVEN, an odd word line driving signal ODD, word line driving signals 2RBE and 2RBO and a sense amp driving signal SAE according to the decoding result.

In detail, the address control unit 10 includes NOR gates NOR1–NOR4 for respectively NORing the strobe address signal ADD<8>, the input address signals ADD<9>, ADD<11> and ADD<12>, and the test signal WBI. Inverters IV1–IV4 delay and logically non-reverse the output from the NOR gate NOR1 and output the address signal AWB<8>. Inverters IV5–IV8 delay and logically non-reverse the output from the NOR gate NOR2 and output the address signal AWB<9>. Inverters IV9–IV12 delay and logically non-reverse the output from the NOR gate NOR3 and output the address signal AWB<11>. Inverters IV13–IV16 delay and logically non-reverse the output from the NOR gate NOR4 and output the address signal AWB<12>. Inverters IV17–IV19 delay and logically non-reverse the address signal AWB<9> and output the address signal AWD<9>. Inverters IV20–IV22 delay and logically non-reverse the address signal AWB<11> and output the address signal AWD<11>. Inverters IV23–IV25 delay and logically non-reverse the address signal AWB<12> and output the address signal AWD<12>.

The strobe signal generating unit 20 includes inverters IV26–IV32 for delaying and logically non-reversing the address signal AWB<8>, and inverters IV33–IV37 for delaying and logically non-reversing the output from the inverter IV32. A NAND gate ND1 NANDs the output from the inverter IV32 and the output from the inverter IV37. A NAND gate ND2 NANDs the output from the NAND gate ND1 and an inputted power up signal PWRUP, and outputs the strobe signal VCMDP.

Finally, the decoding unit 30 includes NAND gates ND3–ND10 for respectively NANDing the address signals AWBD<9>, AWD<9>, AWBD<11>, AWD<11>, AWBD<12> and AWD<12> from the address control unit 10, and inverters IV38–IV45 for respectively inverting the outputs from the NAND gates ND3–ND10. NAND gates ND11–ND18 respectively NANDs the outputs from the inverters IV38–IV45 and the strobe signal VCMDP from the strobe signal generating unit 20. An NMOS transistor N1 receives the power up signal PWRUP inverted by an inverter IV46, and outputs a ground voltage VSS to NAND gates ND19–ND32 composed of a latch. Inverters IV47–IV60 respectively delay the outputs from the NAND gates ND19–ND32, and output the all word line driving signal ALL, the even word line driving signal EVEN, the odd word line driving signal ODD, the word line driving signals 2RBE and 2RBO and the sense amp driving signal SAE.

The conventional decoding circuit for the wafer burn-in test includes the strobe address signal ADD<8> as a first address group for generating the strobe signal VCMDP during the wafer burn-in test, and the input address signals ADD<9>, ADD<11> and ADD<12> as a second address group for selectively enabling the word line driving signals during the wafer burn-in test.

Referring now to FIG. 2, an operational timing view of the conventional decoding circuit for the wafer burn-in test is shown. When the test signal WBI is enabled during the wafer burn-in test, the strobe address signal ADD<8> is enabled, and then the strobe signal VCMDP is generated. When the strobe signal VCMDP is generated from the strobe signal generating unit 20, the decoding unit 30 decodes the address signals AWBD<9>, AWD<9>, AWBD<11>, AWD<11>, AWBD<12> and AWD<12> from the address control unit 10. In addition, while the input address signals ADD<9>, ADD<11> and ADD<12> are simultaneously enabled in a high level, a reset pulse RESETBP is generated at the point when the strobe signal VCMDP is generated.

However, the conventional decoding circuit for the wafer burn-in test needs the strobe address signal ADD<8> for generating the strobe signal VCMDP and the plurality of input address signals ADD<9>, ADD<11> and ADD<12> to perform the wafer burn-in test. Accordingly, the conventional decoding circuit for the wafer burn-in test requires a special pad for receiving the strobe address signal add<8>ADD<8> of controlling generation of the strobe signal VCMDP as well as a pad for receiving the external input address signals ADD<9>, ADD<11> and ADD<12>. As a result, the area of the input pads is increased according to the number of pad is increased and thus the whole layout area of the semiconductor memory device is also increased.

SUMMARY OF THE DISCLOSURE

A decoding circuit for a wafer burn-in test may include: an address control unit for buffering a plurality of externally inputted address signals and generating a plurality of internal address signals in order to selectively enable word line driving signals during the wafer burn-in test; a strobe signal generating unit for generating a plurality of delay pulse signals having a predetermined pulse width according to the plurality of address signals, and generating a strobe signal by logically operating the plurality of delay pulse signals wherein each delay pulse signal is enabled when its corresponding address signal inputted externally is transited, and the strobe signal has a pulse when at least one delay pulse signal is enabled; and a decoding unit for decoding the plurality of internal address signals according to the strobe signal from the strobe signal generating unit, and selectively outputting the word line driving signals.

DETAILED DESCRIPTION OF THE PRESENTLY PREFERRED EMBODIMENTS

Figure 1:
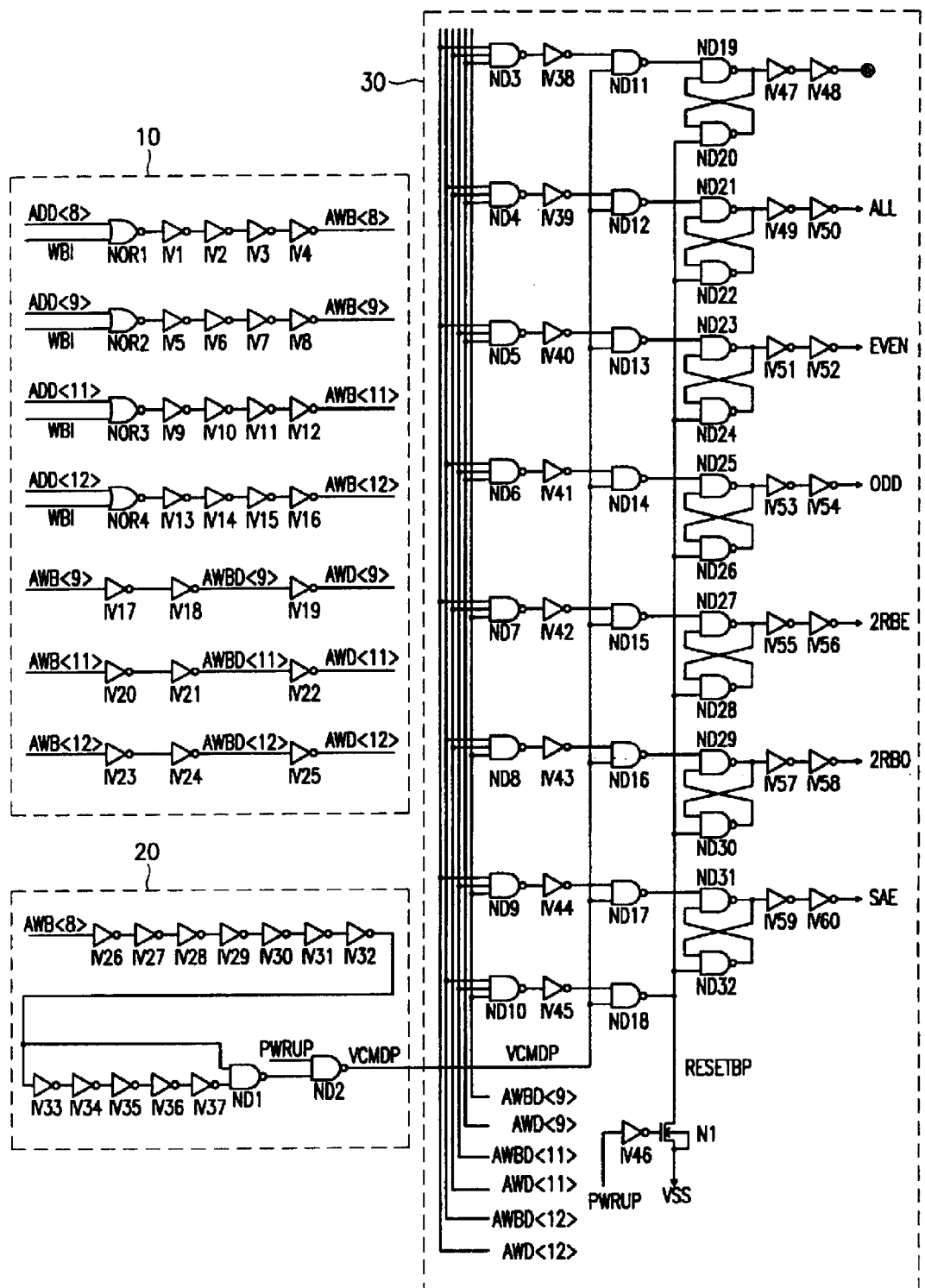
FIG. 1 is a circuit view illustrating a conventional decoding circuit for a wafer burn-in test.
Figure 2:
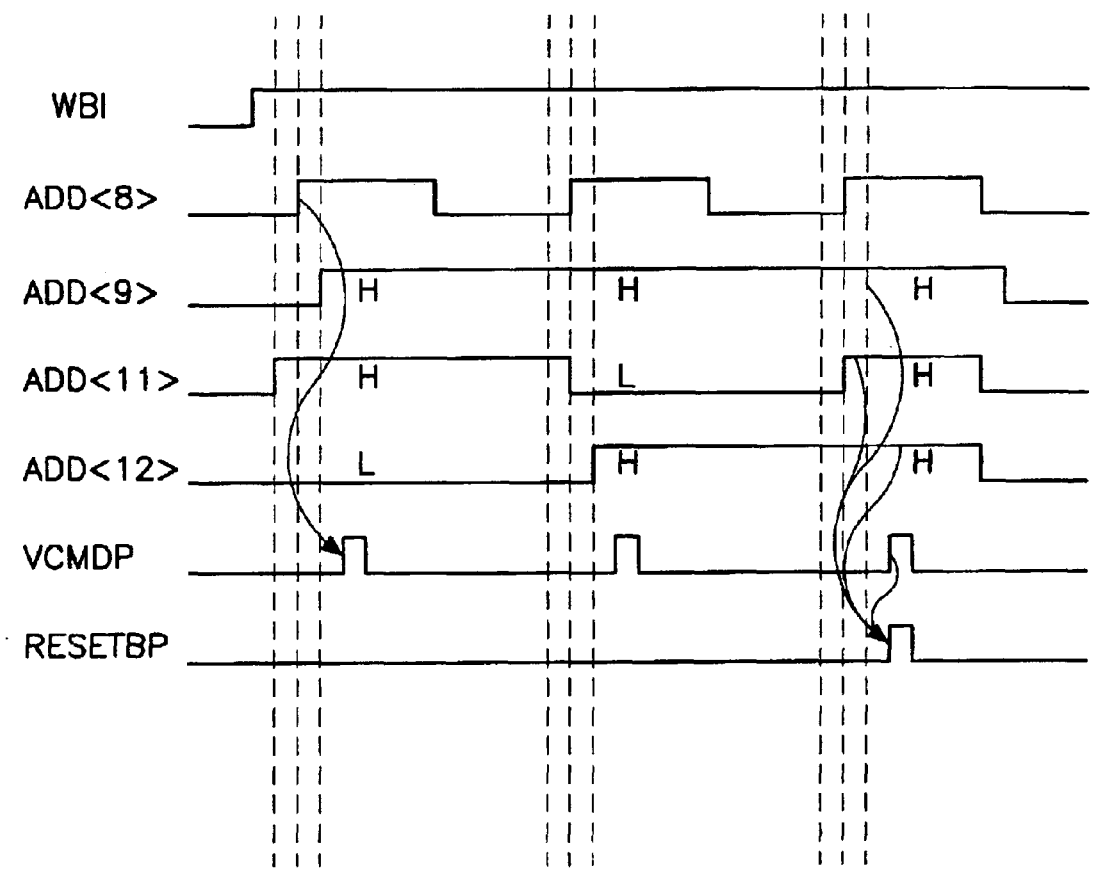
FIG. 2 is an operational timing view of FIG. 1.
Figure 3:
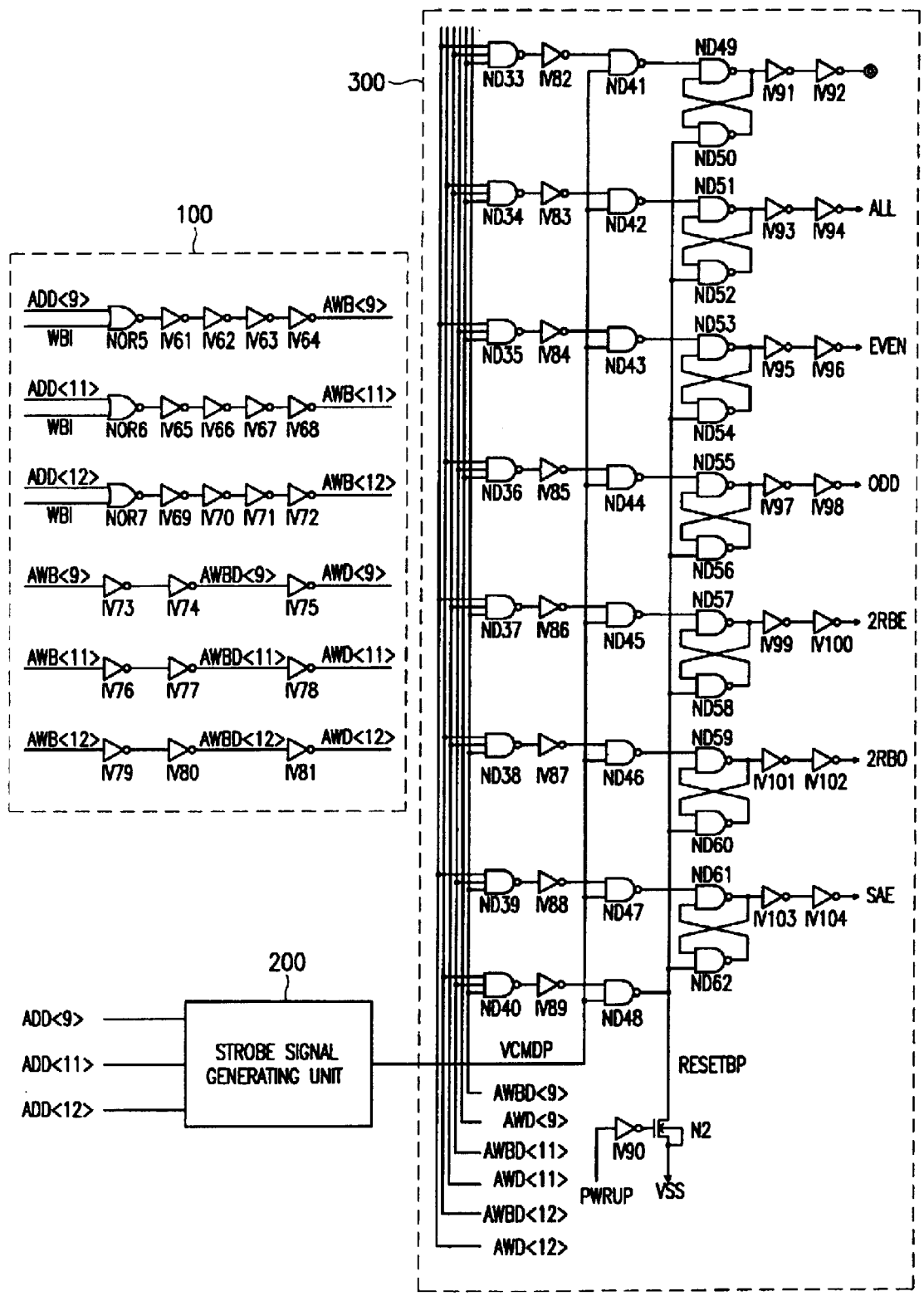
FIG. 3 is a circuit view illustrating a decoding circuit for a wafer burn-in test.

Turning now to FIG. 3, a decoding circuit for the wafer burn-in test includes an address control unit 100, a strobe signal generating unit 200 and a decoding unit 300. The address control unit 100 logically operates external input address signals ADD<9>, ADD<11> and ADD<12> and a test signal WBI, and generates address signals AWB<9>, AWB<11> and >AWB<12>. In addition, the address control unit 100 buffers the address signals AWB<9>, AWB<11> and AWB<12>, and generates address signals AWD<9>, AWD<11> and AWD<12>. The strobe signal generating unit 200 internally generates a strobe signal VCMDP according to the input address signals ADD<9>, ADD<11> and ADD<12>. The decoding unit 300 receives the address signals AWBD<9>, AWD<9>, AWBD<11>, AWD<11>, >AWBD<12> and AWD<12> and the strobe signal VCMDP, and decodes the received signals. In addition, the decoding unit 300 selectively outputs an all word line driving signal ALL, an even word line driving signal EVEN, an odd word line driving signal ODD, word line driving signals 2RBE and 2RBO and a sense amp driving signal SAE according to the decoding result.

Referring to FIG. 3, the address control unit 100 includes NOR gates NOR5–NOR7 for respectively NORing the input address signals ADD<9>, ADD<11> and ADD<12> and the test signal WBI. Inverters IV61–IV64 delay and logically non-reverse the output from the NOR gate NOR5 and output the address signal AWB<9>, inverters IV65–IV68 delay and logically non-reverse the output from the NOR gate NOR6 and output the address signal awb<11>AWB<11>, and inverters IV69–IV72 delay and logically non-reverse the output from the NOR gate NOR7 and output the address signal AWB<12>. Similarly, inverters IV73–IV75 delay and logically reverse the address signal AWB<9> and output the address signal AWD<9>, inverters IV76–IV78 delay and logically reverse the address signal awb<11>AWB<11> and output the address signal awd<11>AWD<11>. Inverters IV79–IV81 delay and logically reverse the address signal AWB<12> and output the address signal AWD<12>.

The decoding unit 300 includes NAND gates ND33–ND40 for respectively NANDing and outputting the address signals AWBD<9>, AWD<9>, AWBD<11>, AWD<11>, AWBD<12> and AWD<12>, and inverters IV82–IV89 for respectively inverting the outputs from the NAND gates ND33–ND40. NAND gates ND41–ND48 respectively NANDs the outputs from the inverters IV82–IV89 and the strobe signal VCMDP from the strobe signal generating unit 200. A NMOS transistor N2 receives a power up signal PWRUP inverted by an inverter IV90, and outputs a ground voltage VSS to NAND gates ND49–ND62 composed of a latch. Finally, inverters IV91–IV104 delay and logically non-reverse the outputs from the NAND gates ND49–ND62, and output an all word line driving signal ALL, an even word line driving signal EVEN, an odd word line driving signal ODD, the two word line driving signals 2RBE and 2RBO and a sense amp driving signal SAE.

Figure 4:
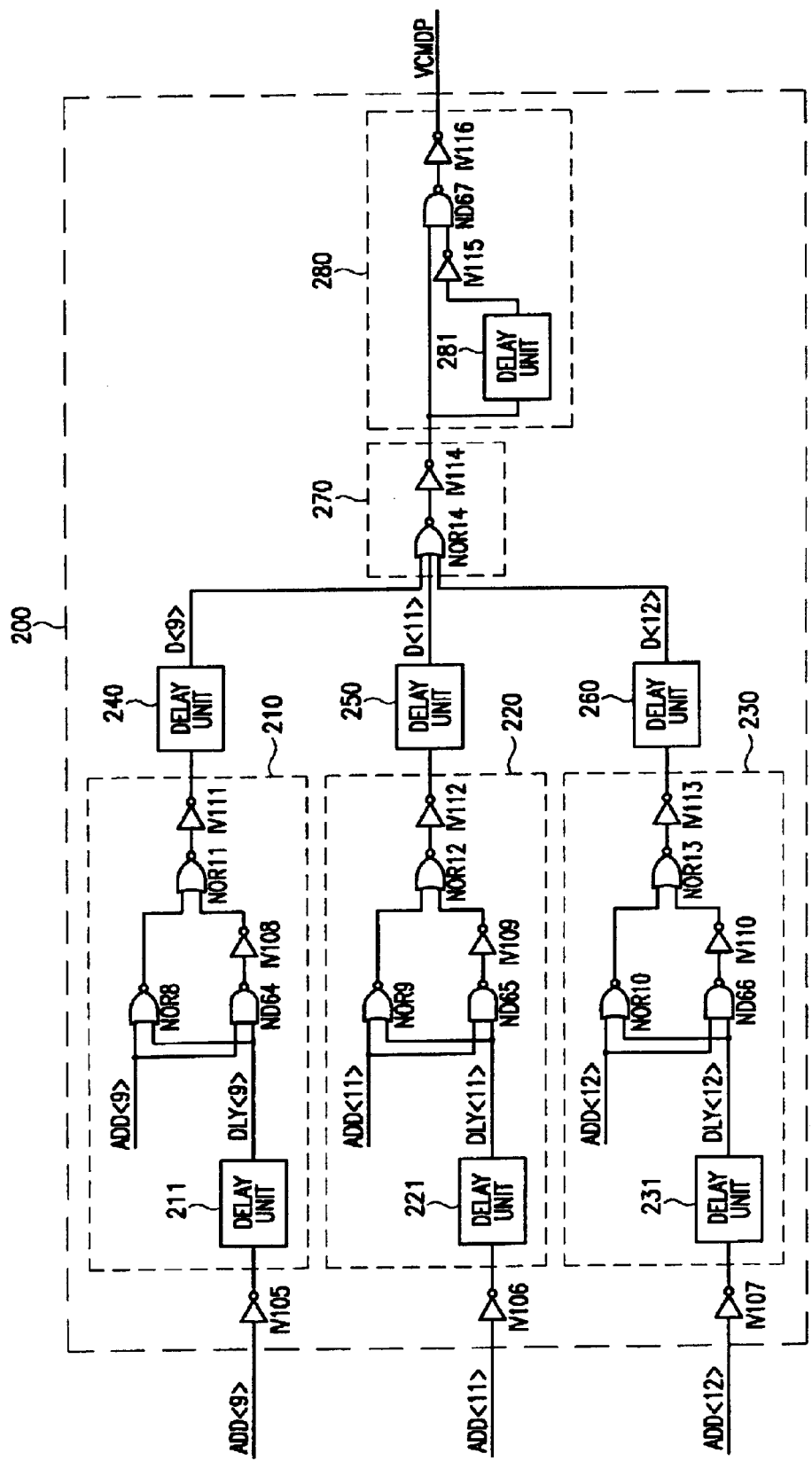
FIG. 4 is a detailed circuit view illustrating an example of a strobe signal generating unit of FIG. 3.

Turning to FIG. 4, there is illustrated a detailed circuit view of the strobe signal generating unit 200 of FIG. 3. The strobe signal generating unit 200 includes an inverter IV105 for inverting the input address signal ADD<9>. A pulse generating unit 210 generates a pulse signal by logically operating a delay signal DLY<9> obtained by delaying the inverted input address signal ADD<9> for a predetermined time and the input address signal ADD<9>. An inverter IV106 inverts the input address signal ADD<11>. A pulse generating unit 220 generates a pulse signal by logically operating a delay signal DLY<11> obtained by delaying the inverted input address signal ADD<11> for a predetermined time and the input address signal ADD<11>. An inverter IV107 inverts the input address signal ADD<12>. A pulse generating unit 230 generates a pulse signal by logically operating a delay signal DLY<12> obtained by delaying the inverted input address signal ADD<12> for a predetermined time and the input address signal ADD<12>.

The strobe signal generating unit 200 also includes a delay unit 240 for delaying the pulse signal from the pulse generating unit 210 for a predetermined time, and outputting a delay pulse signal D<9>. A delay unit 250 delays the pulse signal from the pulse generating unit 220 for a predetermined time, and outputs a delay pulse signal D<11>. A delay unit 260 delays the pulse signal from the pulse generating unit 230 for a predetermined time, and outputs a delay pulse signal D<12>.

In addition, the strobe signal generating unit 200 includes a logic unit 270 for logically operating the delay pulse signals D<9>, D<11> and D<12>, and a pulse generating unit 280 for generating a pulse signal according to the output signal from the logic unit 270, and outputting the strobe signal VCMDP.

In detail, the pulse generating unit 210 includes a delay unit 211 for delaying the inverted input address signal ADD<9> for a predetermined time, and outputting the delay signal DLY<9>. A NOR gate NOR8 NORs the input address signal ADD<9> and the delay signal DLY<9>. A NAND gate ND64 NANDs the input address signal ADD<9> and the delay signal DLY<9>. A NOR gate NOR11 NORs the output signal from the NOR gate NOR8 and the output signal from the NAND gate ND64 inverted by an inverter IV108. An inverter IV110 inverts the output signal from the NOR gate NOR11 and outputs the pulse signal.

The pulse generating unit 220 includes a delay unit 221 for delaying the inverted input address signal ADD<11> for a predetermined time, and outputting the delay signal DLY<11>. A NOR gate NOR9 NORs the input address signal ADD<11> and the delay signal DLY<11>. A NAND gate ND65 NANDs the input address signal ADD<11> and the delay signal DLY<11>. A NOR gate NOR12 NORs the output signal from the NOR gate NOR9 and the output signal from the NAND gate ND65 inverted by an inverter IV109. An inverter IV112 inverts the output signal from the NOR gate NOR12 and outputs the pulse signal.

In addition, the pulse generating unit 230 includes a delay unit 231 for delaying the inverted input address signal ADD<12> for a predetermined time, and outputting the delay signal DLY<12>. A NOR gate NOR10 NORs the input address signal ADD<12> and the delay signal DLY<12>. A NAND gate ND66 NANDs the input address signal ADD<12> and the delay signal DLY<12>. A NOR gate NOR13 NORs the output signal from the NOR gate NOR10 and the output signal from the NAND gate ND66 inverted by an inverter IV110. An inverter IV113 inverts the output signal from the NOR gate NOR13 and outputs the pulse signal.

The logic unit 270 includes a NOR gate NOR14 for NORing the delay pulse signals D<9>, D<11> and D<12>, and an inverter IV114 for inverting the output from the NOR gate NOR14.

Finally, the pulse generating unit 280 includes a delay unit 281 for delaying the output from the inverter IV114 for a predetermined time, and a NAND gate ND67 for NANDing the output signal from the logic unit 270 and the output signal from the delay unit 281 inverted by an inverter IV115. An inverter IV116 inverts the output from the NAND gate ND67 and outputs the strobe signal VCMDP.

Figure 5:
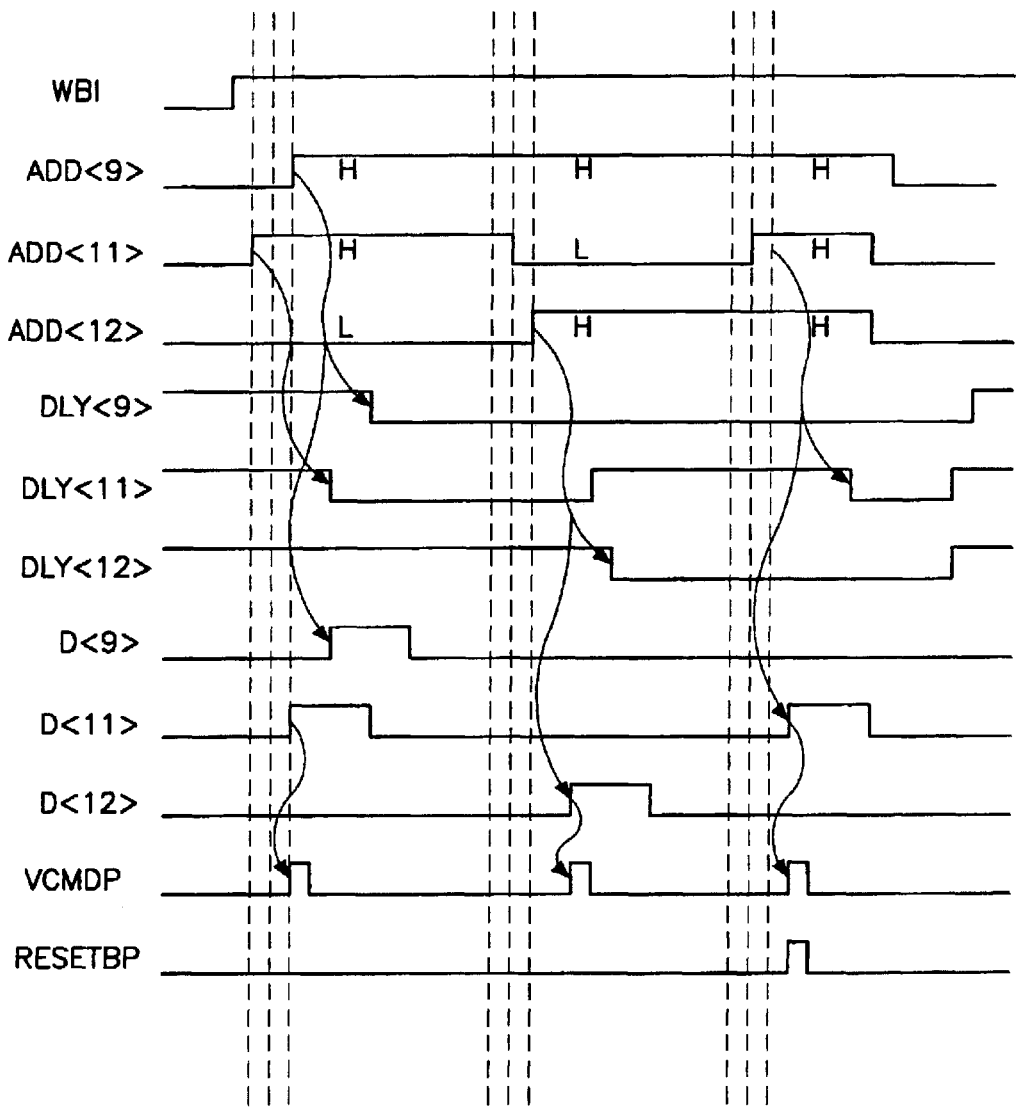
FIG. 5 is an operational timing view of FIG. 3.

The operation of the decoding circuit for the wafer burn-in test of FIGS. 3 and 4 is illustrated with reference to an operational timing view of FIG. 5. When the test signal WBI is enabled during the wafer burn-in test, the input address signals ADD<11>, ADD<9> and ADD<12> are inputted. The delay unit 221, the delay unit 211 and the delay unit 231 respectively delay the input address signals ADD<11>, ADD<9> and ADD<12>, and output the delay signals DLY<11>, DLY<9> and DLY<12>.

The pulse generating units 210–230 generate the pulse signals having a pulse width as long as the delay time of the delay signals DLY<11>, DLY<9> and DLY<12> and the input address signals ADD<11>, ADD<9> and ADD<12>. Thereafter, the pulse delay signals D<11>, D<9> and D<12> are generated through the delay unit 250, the delay unit 240 and the delay unit 260 which guarantee a skew of the equipment.

Therefore, the strobe signal VCMDP is generated through the logic unit 270 according to a transition time of one of the pulse delay signals D<11>, D<9> and D<12>, And thus, has a pulse width as long as the delay time of the delay unit 281.

In order to generate the strobe signal VCMDP, the input address signals ADD<9>, ADD<11> and ADD<12> are logically operated and delayed for a predetermined time. That is, the strobe signal VCMDP is generated by using the external input address signals ADD<9>, ADD<11> and ADD<12> to selectively enable the word line driving signals during the wafer burn-in test. Accordingly, an input pad for the strobe address signals inputted to generate the strobe signal VCMDP is not necessary.

As discussed earlier, the decoding circuit for the wafer burn-in test does not use the input pad for the strobe address signals inputted to generate the strobe signal, thereby decreasing the number of input pads, thus reducing the whole layout area of a semiconductor memory device.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A decoding circuit for a wafer burn-in test, comprising:
   an address control unit for buffering a plurality of externally inputted address signals and generating a plurality of internal address signals in order to selectively enable word line driving signals during the wafer burn-in test;
   a strobe signal generating unit for generating a plurality of delay pulse signals having a predetermined pulse width according to the plurality of address signals, and generating a strobe signal by logically operating the plurality of delay pulse signals wherein each delay pulse signal is enabled when its corresponding address signal inputted externally is transited, and the strobe signal has a pulse when at least one delay pulse signal is enabled; and
   a decoding unit for decoding the plurality of internal address signals according to the strobe signal from the strobe signal generating unit, and selectively outputting the word line driving signals.

2. The circuit according to claim 1, wherein the strobe signal generating unit comprises:
   a plurality of first pulse generating means for respectively outputting a plurality of pulse signals having a predetermined pulse width according to the plurality of externally inputted address signals;
   a plurality of delay means for respectively delaying the plurality of pulse signals from the plurality of first pulse generating means, and outputting the plurality of delay pulse signals;
   a logic means for logically operating the plurality of delay pulse signals from the plurality of delay means; and
   a second pulse generating means for generating a pulse according to the output signal from the logic means, and outputting the strobe signal.

3. The circuit according to claim 2, wherein the first pulse generating means comprises:
   a first delay unit for delaying the corresponding externally inputted address signal;
   a first logic element for NORing the externally inputted address signal and the output signal from the first delay unit;
   a second logic element for NANDing the externally inputted address signal and the output signal from the first delay unit;
   a third logic element for NORing the output signal from the first logic element and the inverted output signal from the second logic element; and
   a first inverter for inverting the output signal from the third logic element, and outputting the pulse signal.

4. The circuit according to claim 3, further comprising a second inverter for inverting the corresponding externally inputted address signal, and outputting it to the first delay unit.

5. The circuit according to claim 2, wherein the delay means comprises first delay elements for delaying and logically non-reversing the output signals from the first pulse generating means.

6. The circuit according to claim 2, wherein the logic means comprises:

a fourth logic element for NORing the plurality of delay pulse signals from the delay means; and a third inverter for inverting the output signal from the fourth logic element.

7. The circuit according to claim 2, wherein the second pulse generating means comprises:

a second delay unit for delaying the output signal from the logic means;

a fifth logic element for logically operating the output signal from the logic means and the output signal from the second delay unit; and a third inverter for inverting the output signal from the fifth logic element and outputting the strobe signal.

8. The circuit according to claim 7, wherein the second delay unit comprises second delay elements for delaying and logically non-reversing the output signal from the logic means.

9. The circuit according to claim 7, wherein the fifth logic element is a NAND gate.

10. The circuit according to claim 7, wherein the fifth logic element is a NOR gate.

11. A decoding circuit for a wafer burn-in test, comprising:

an address control means for buffering a plurality of externally inputted address signals, and generating a plurality of internal address signals in order to selectively enable word line driving signals during the wafer burn-in test;

a strobe signal generating means for generating a strobe signal according to a transition state of the plurality of externally inputted address signals; and a decoding means for decoding the plurality of internal address signals according to the strobe signal from the strobe signal generating means, and selectively outputting the word line driving signals, wherein the strobe signal generating means comprises:

a plurality of first pulse generating means for respectively delaying a plurality of pulse signals having a predetermined pulse width according to the plurality of externally inputted address signals, and outputting a plurality of delay pulse signals; and a second pulse generating means for generating the strobe signal having a pulse of a predetermined width when at least one delay pulse signals is transited among the plurality of delay pulse signals.

12. The circuit according to claim 11, wherein the first pulse generating means comprises:

a plurality of first pulse generating units for respectively outputting the plurality of pulse signals having the predetermined pulse width according to the plurality of externally inputted address signals; and a plurality of first delay means for respectively delaying the plurality of pulse signals, and outputting the plurality of delay pulse signals.

13. The circuit according to claim 12, wherein the first pulse generating unit comprises:

a first delay unit for delaying the corresponding address signal inputted externally;

a first logic element for NORing the externally inputted address signal and the output signal from the first delay unit;

a second logic element for NANDing the externally inputted address signal and the output signal from the first delay unit;

a third logic element for NORing the output signal from the first logic element and the inverted output signal from the second logic element; and a first inverter for inverting the output signal from the third logic element, and outputting the pulse signal.

14. The circuit according to claim 11, wherein the second pulse generating means comprises:

a logic element for logically operating the plurality of delay pulse signals; and a second pulse generating unit for generating the pulse according to the output signal from the logic element, and outputting the strobe signal.

15. The circuit according to claim 14, wherein the logic means comprises:

a fourth logic element for NORing the plurality of delay pulse signals; and a third inverter for inverting the output signal from the fourth logic element.

16. The circuit according to claim 14, wherein the second pulse generating unit comprises:

a second delay unit for delaying the output signal from the logic means;

a fifth logic element for logically operating the output signal from the logic means and the inverted output signal from the second delay unit; and a third inverter for inverting the output signal from the fifth logic element, and outputting the strobe signal.

17. The circuit according to claim 16, wherein the second delay unit comprises second delay elements for delaying and logically non-reversing and outputting the output signal from the logic means.

18. The circuit according to claim 16, wherein the fifth logic element is a NAND gate.

19. The circuit according to claim 16, wherein the fifth logic element is a NOR gate.

* * * * *